United States Patent
Son et al.

(10) Patent No.: US 6,924,207 B2
(45) Date of Patent: Aug. 2, 2005

(54) METHOD OF FABRICATING A METAL-INSULATOR-METAL CAPACITOR

(75) Inventors: Hong-Seong Son, Suwon (KR); Sang-Rok Hah, Seoul (KR); Ja-Eung Koo, Goyang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/696,438

(22) Filed: Oct. 29, 2003

(65) Prior Publication Data

US 2004/0126984 A1 Jul. 1, 2004

(30) Foreign Application Priority Data

Dec. 26, 2002 (KR) .................. 10-2002-0084633

(51) Int. Cl.[7] .............................................. H01L 21/20
(52) U.S. Cl. ................... 438/396; 438/253; 438/393; 438/618; 438/611; 438/381
(58) Field of Search .................. 438/253, 393–396, 438/611, 618, 381

(56) References Cited

U.S. PATENT DOCUMENTS

| | | | | |
|---|---|---|---|---|
| 4,497,107 A | * | 2/1985 | Cogan | 438/192 |
| 5,795,819 A | * | 8/1998 | Motsiff et al. | 438/618 |
| 6,259,128 B1 | | 7/2001 | Adler et al. | 247/301 |
| 6,342,734 B1 | * | 1/2002 | Allman et al. | 257/758 |
| 6,344,964 B1 | * | 2/2002 | Adler | 361/306.3 |
| 6,440,835 B1 | * | 8/2002 | Lin | 438/611 |
| 6,452,779 B1 | * | 9/2002 | Adler et al. | 361/306.3 |
| 6,461,914 B1 | * | 10/2002 | Roberts et al. | 438/253 |
| 6,504,202 B1 | * | 1/2003 | Allman et al. | 257/303 |
| 6,534,374 B2 | * | 3/2003 | Johnson et al. | 438/381 |
| 6,710,425 B2 | * | 3/2004 | Bothra | 257/532 |
| 6,713,840 B1 | * | 3/2004 | Lee et al. | 257/535 |
| 6,730,573 B1 | * | 5/2004 | Ng et al. | 438/381 |
| 6,734,053 B2 | * | 5/2004 | Liu et al. | 438/197 |
| 6,734,079 B2 | * | 5/2004 | Huang et al. | 438/396 |
| 6,740,974 B2 | * | 5/2004 | Yoshitomi | 257/751 |
| 6,746,914 B2 | * | 6/2004 | Kai et al. | 438/253 |
| 6,762,109 B2 | * | 7/2004 | Murata | 438/396 |
| 6,764,915 B2 | * | 7/2004 | Lee | 438/396 |

* cited by examiner

*Primary Examiner*—Maria F. Guerrero
(74) *Attorney, Agent, or Firm*—F. Chau & Associates

(57) ABSTRACT

A method of fabricating a semiconductor device is provided. The method includes forming an interconnection line over a ssubstrate. The interconnection line functions as a first electrode. A first insulating layer is formed on the substrate including the metal interconnection line. An electrode layer and an oxide layer are formed on the first insulating layer. A photoresist pattern is formed on the oxide layer. The oxide layer and the electrode layer are etched using the photoresist pattern as an etching mask. As a result, a second electrode and an oxide layer pattern, which are stacked, are formed over the interconnection line. At least the electrode layer is etched using a wet etching technique. The photoresist pattern is then removed.

20 Claims, 3 Drawing Sheets

METHOD OF FABRICATING A METAL-INSULATOR-METAL CAPACITOR

BACKGROUND OF THE INVENTION

1. Field of the Invention

The present invention relates to a method of fabricating a semiconductor device and, more particularly, to a method of fabricating a metal-insulator-metal capacitor.

2. Description of Related Art

Metal interconnections are employed in the fabrication of semiconductor devices. The metal interconnections should have low electrical resistance and high reliability in order to realize high performance of semiconductor devices. Copper interconnections are very attractive because such interconnections exhibit low electrical resistance and high reliability. However, it is difficult to form copper interconnections using a conventional photolithography/etching process. Thus, a damascene process is widely used in formation of the copper interconnections. A damascene process is a process of embedding a metal conductor pattern in a dielectric film on a substrate, which results in a planar interconnection layer.

Most semiconductor devices comprise transistors, resistors and capacitors. Each capacitor is composed of a top electrode and a bottom electrode that overlap each other and a dielectric layer interposed between the top and bottom electrodes. The electrodes may be formed of a doped polysilicon layer. However, the polysilicon layer can be oxidized during a subsequent thermal process. Accordingly, electrical characteristics of the capacitor may be changed. In addition, the capacitor may exhibit non-uniform characteristics with respect to the magnitude of voltage applied to the polysilicon electrode. For example, if the top and bottom electrodes are formed of an N-type polysilicon layer and a negative voltage is applied to the top electrode, holes are induced at the surface of the bottom electrode. Thus, a depletion layer may be formed at the surface of the bottom electrode. A width of the depletion layer varies according to the magnitude of the negative voltage. As a result, the capacitance may be not be uniform depending on the magnitudes of the voltages applied to the electrodes. Therefore, the capacitor employing the polysilicon electrodes is inadequate for a semiconductor device that needs uniform characteristics, for example an analog circuit device.

A capacitor having metal electrodes, e.g., a metal-insulator-metal (MIM) capacitor has been proposed in order to solve the above-mentioned problems. The MIM capacitor is discussed in U.S. Pat. No. 6,259,128 to Adler et al., entitled "Metal-Insulator-Metal Capacitor For Copper Damascene Process And Method Of Forming The Same."

FIGS. 1 and 2 are cross sectional views for illustrating a known method of fabricating the MIM capacitor.

Referring to FIG. 1, an interlayer insulating layer 3 is formed on a semiconductor substrate 1. A first copper interconnection line 5a and a second copper interconnection line 5b are formed in the interlayer insulating layer 3 using a conventional damascene technique. A silicon nitride layer 7 is formed on the substrate 1 having the first and second copper interconnection lines 5a and 5b, and the silicon nitride layer 7 is patterned to expose the first copper interconnection line 5a. A first lower barrier layer 9, a bottom electrode layer 11, a first upper barrier layer 13, a dielectric layer 15, a second lower barrier layer 17, a top electrode layer 19 and a second upper barrier layer 21 are sequentially formed on the substrate 1 including the patterned silicon nitride layer 7. A photoresist pattern 23 is then formed on the second upper barrier layer 21. The photoresist pattern 23 is formed over the first copper interconnection line 5a.

Referring to FIG. 2, the second upper barrier layer 21, the top electrode layer 19, the second lower barrier layer 17, the dielectric layer 15, the first upper barrier layer 13, the bottom electrode layer 11 and the first lower barrier layer 9 are successively etched using the photoresist pattern 23 as an etching mask, thereby forming an MIM capacitor 25 electrically connected to the first copper interconnection line 5a. The etching process for forming the MIM capacitor 25 is performed using a wet etching technique. As a result, the MIM capacitor 25 is composed of a first lower barrier layer pattern 9a, a bottom electrode 11a, a first upper barrier layer pattern 13a, a dielectric layer pattern 15a, a second lower barrier layer pattern 17a, a top electrode 19a and a second upper barrier layer pattern 21a, which are sequentially stacked, as shown in FIG. 2.

The photoresist pattern 23 is removed using an ashing process. The ashing process is performed using oxygen plasma. Generally, the ashing process is followed by a wet strip process for removing photoresist residue and polymers. The wet strip process is carried out using a chemical solution containing hydrofluoric acid (HF). However, in the event that the MIM capacitor 25 is patterned using the wet etching technique as mentioned above, polymers are not generated. Thus, the wet strip process may not be required after the ashing process for removing the photoresist pattern 23.

If a dry etching technique using plasma is employed instead of the wet etching technique, the patterned silicon nitride layer 7 on the second copper interconnection line 5b may be damaged. As a result, pits may be formed in regions of the patterned silicon nitride layer 7 that may expose regions of the second copper interconnection line 5b. In this case, if the ashing process is applied in order to remove the photoresist pattern 23, the exposed regions of the second copper interconnection line 5b may be oxidized. The oxidation of the second copper interconnection line 5b results in a volume expansion thereof. Accordingly, the oxidized regions of the second copper interconnection line 5b upwardly protrude through the pits. After the ashing process, the wet strip process should be performed in order to remove polymers generated during the dry etching process. The oxidized regions of the second copper interconnection line 5b are removed during the wet strip process. As a result, voids are formed in the second copper interconnection line 5b, thereby degrading reliability of the second copper interconnection line 5b.

Therefore, the patterning process for forming the MIM capacitor 25 may be performed using the wet etching technique so as to avoid the disadvantages of dry etching.

However, four layers of barrier material, two layers of electrode material and one layer of dielectric material are patterned using the wet etching technique. Thus, various kinds of wet etching solutions are required in order to form the MIM capacitor 25. As a result, the burden on the photoresist pattern is increased during the wet etching process and the photoresist pattern may be displaced or deformed during the wet etching process. Accordingly, there exists a need for a method of fabricating an MIM capacitor that reduces the burden on the photoresist pattern during wet etching.

SUMMARY OF THE INVENTION

In accordance with the present invention, a method of fabricating a semiconductor device includes forming an interconnection line over a substrate. The interconnection line functions as a first electrode. A first insulating layer is formed on the substrate and the interconnection line. An electrode layer and an oxide layer are formed on the first insulating layer, and a photoresist pattern is formed on the oxide layer. The oxide layer and the electrode layer are etched using the photoresist pattern as an etching mask, thereby forming a second electrode and an oxide layer pattern, which are stacked over the interconnection line. At least the electrode layer is etched using a wet etching process. The photoresist pattern is then removed.

Formation of the interconnection line may comprise forming a second insulating layer on the substrate and forming a pattern in the second insulating layer using a damascene process. The pattern is preferably formed from a copper layer.

Preferably, the first insulating layer is formed of a dielectric layer. For example, the dielectric layer is preferably formed of a silicon nitride (SiN) layer, a silicon carbide (SiC) layer, silicon oxycarbide (SiOC) or a silicon carbontride (SiCN) layer.

Also, the electrode layer may be formed of a tantalum nitride (TaN) layer, a tantalum (Ta) layer, a titanium (Ti) layer, a titanium nitride (TiN) layer, a tungsten (W) layer or a tungsten nitride (WN) layer. If the electrode layer is formed of the tantalum nitride layer, the tantalum layer, the titanium layer or the titanium nitride layer, the process of etching the oxide layer and the electrode layer is preferably performed using a mixture of hydrofluoric acid (HF) and nitric acid ($HNO_3$) as a wet etchant. If the electrode layer is formed of a tungsten layer or a tungsten nitride layer, the oxide layer may be etched using a dry etching technique or a wet etching technique and the electrode layer may be wet-etched using hydrogen peroxide ($H_2O_2$).

Another method of fabricating a semiconductor device, in accordance with the present invention, includes forming an interconnection line over a substrate, wherein the interconnection line functions as a first electrode, forming an insulating layer on the substrate and the interconnection line, forming an electrode layer on the insulating layer, forming a photoresist pattern on the electrode layer, and wet-etching the electrode layer to form a second electrode.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Figure 1:
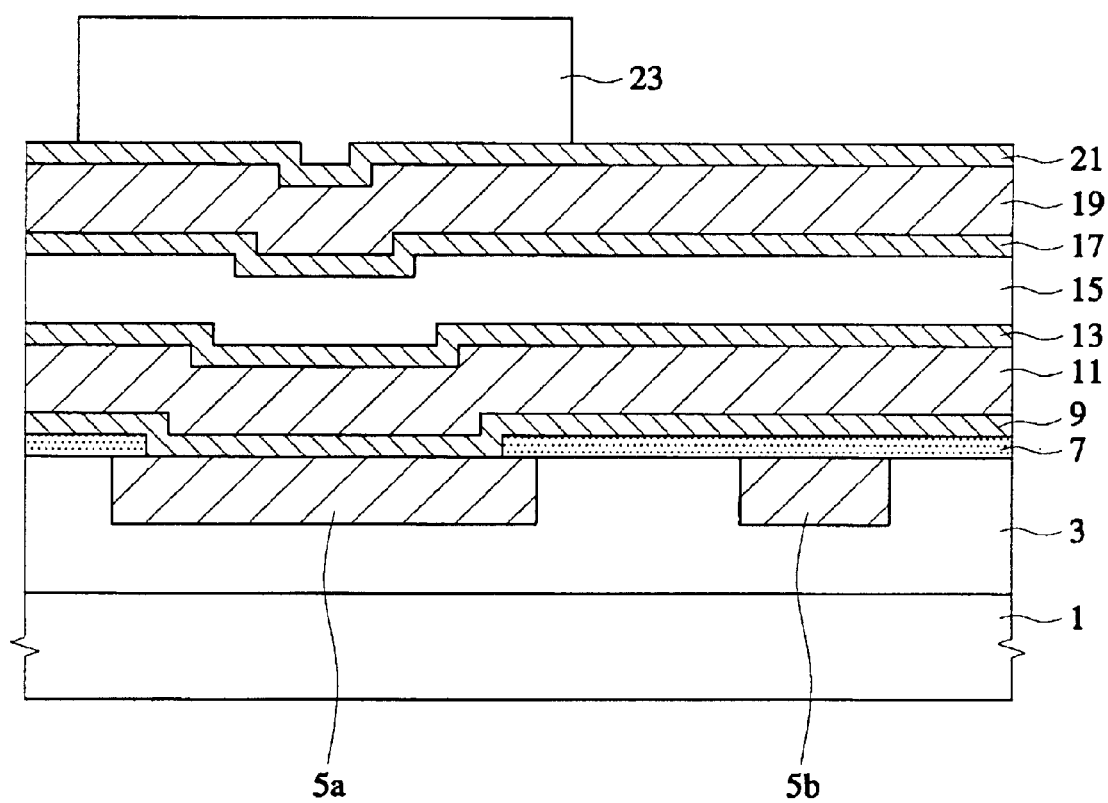
FIGS. 1 and 2 are cross sectional views of an MIM capacitor for illustrating a conventional method of fabricating same.
Figure 2:
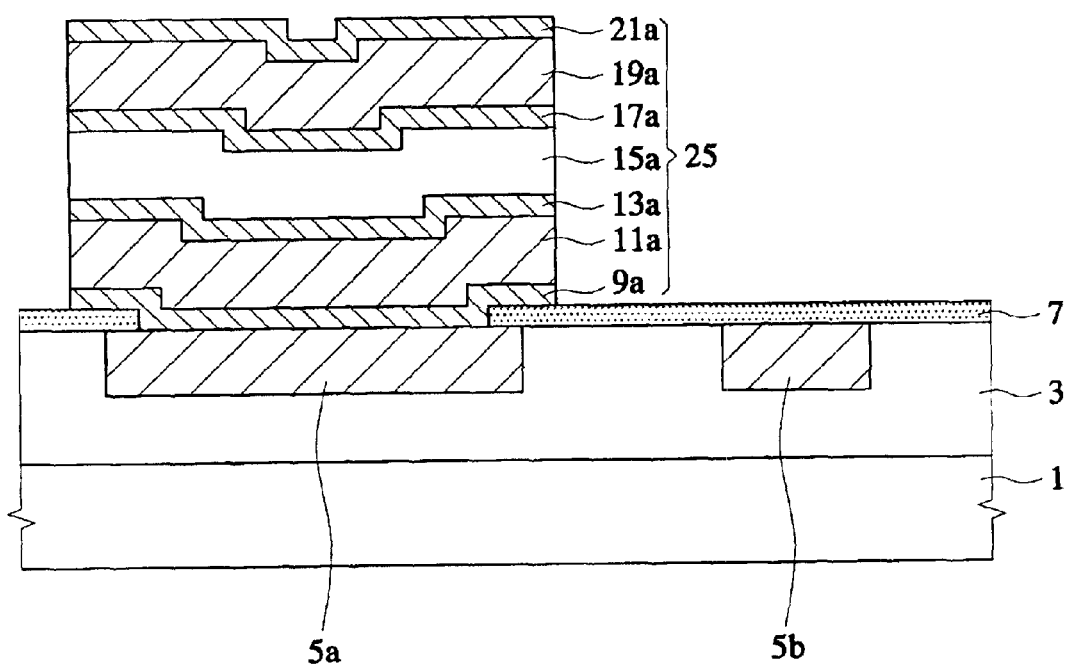

Preferred embodiments of the present invention will be described below in more detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 3:
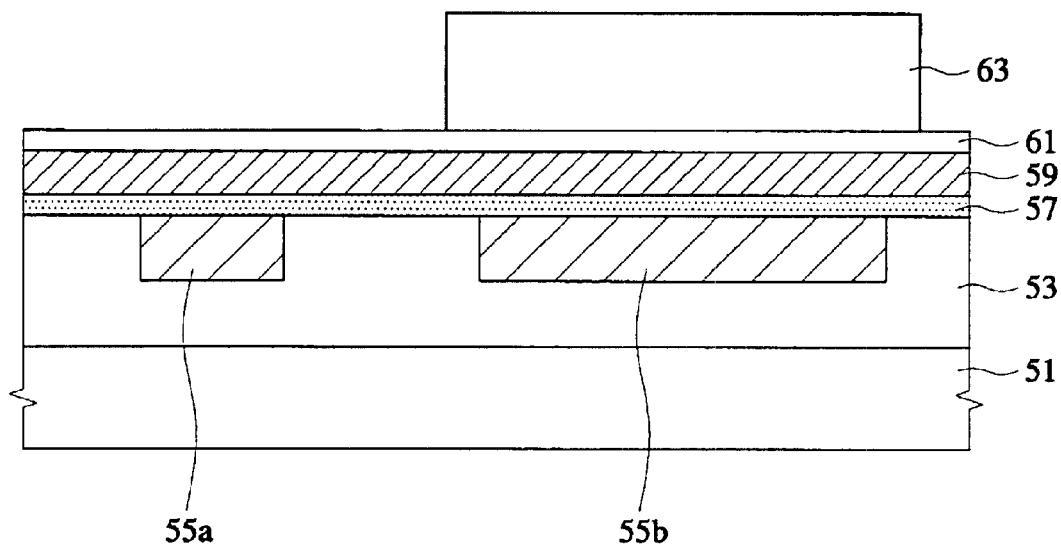
FIGS. 3 and 4 are cross sectional views of an MIM capacitor for illustrating a method of fabricating same according to an embodiment of the present invention.
Figure 4:
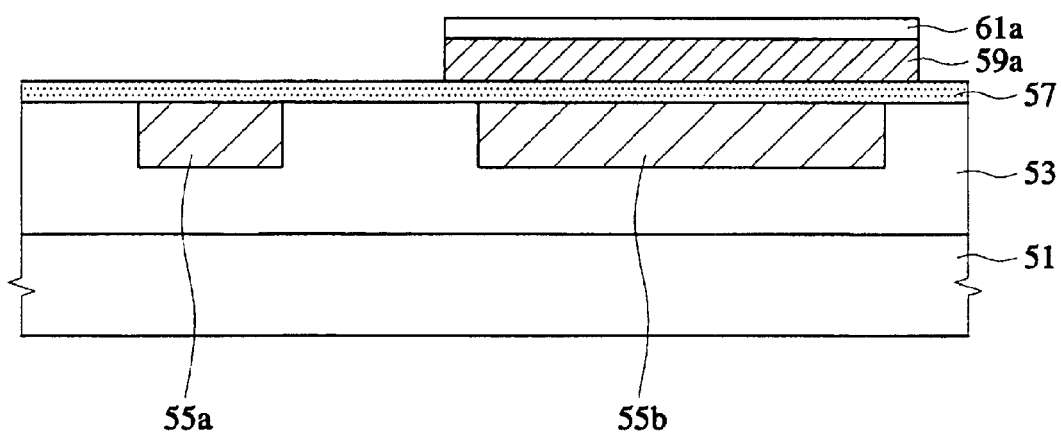

FIGS. 3 and 4 are cross sectional views of an MIM capacitor for illustrating a method of fabricating an MIM capacitor according to an embodiment of the present invention.

Referring to FIG. 3, an interlayer insulating layer 53 is formed on a semiconductor substrate 51. A first metal interconnection line 55a and a second metal interconnection line 55b are formed in the interlayer insulating layer 53 using damascene techniques known to those of ordinary skill in the art. The second metal interconnection line 55b acts as a bottom electrode of an MIM capacitor according to the present invention. The first and second metal interconnection lines 55a and 55b may be formed of copper. An insulating layer 57 is formed on the substrate having the first and second metal interconnection lines 55a and 55b. The insulating layer 57 is preferably formed of a dielectric layer that can prevent metal atoms in the metal interconnection lines 55a and 55b from being diffused out. For example, if the metal interconnection lines 55a and 55b are formed from a copper layer, the insulating layer 57 may be formed of a silicon nitride (SiN) layer, a silicon carbide (SiC) layer, a silicon oxycarbide (SiOC) layer or a silicon carbonitride (SiCN) layer.

A top metal electrode layer 59, a buffer oxide layer 61 and a photoresist layer are sequentially formed on the insulating layer 57. The top metal electrode layer 59 may be formed of a tantalum (Ta) layer, a tantalum nitride (TaN) layer, a titanium (Ti) layer or a titanium nitride (TiN) layer. Alternatively, the top metal electrode layer 59 may be formed of a tungsten (W) layer or a tungsten nitride (WN) layer. The buffer oxide layer 61 is preferably formed of a chemical vapor deposition (CVD) oxide layer. The buffer oxide layer 61 enhances adhesion between the photoresist layer and the top metal electrode layer 59. The photoresist layer is then patterned using photolithography techniques known to those of ordinary skill in the art, thereby forming a photoresist pattern 63 over the second metal interconnection line 55b.

Referring to FIG. 4, the buffer oxide layer 61 and the top metal electrode layer 59 are successively etched using the photoresist pattern 63 as an etching mask. As a result, a top metal electrode 59a and a buffer oxide layer pattern 61a, which are sequentially stacked over the second metal interconnection line 55b, are formed. If the top metal electrode layer 59 is formed of a tantalum (Ta) layer, a tantalum nitride (TaN) layer, a titanium (Ti) layer or a titanium nitride (TiN) layer, the buffer oxide layer 61 and the top metal electrode layer 59 are preferably wet-etched using a mixture of hydrofluoric acid (HF) and nitric acid ($HNO_3$). The mixture of hydrofluoric acid (HF) and nitric acid ($HNO_3$) etches the tantalum (Ta) layer, the tantalum nitride (TaN) layer, the titanium (Ti) layer or the titanium nitride (TiN) layer and the buffer oxide layer 61. As a result, the buffer oxide layer pattern 61a and the top metal electrode 59a may be formed using a single wet etching step.

Alternatively, in the event that the top metal electrode layer 59 is formed of a tungsten (W) layer or a tungsten (WN) nitride layer, the buffer oxide layer 61 and the top metal electrode layer 59 may be etched using two etching steps. The buffer oxide layer 61 can be etched using a first etching step, and the top metal electrode layer 59 can be etched using a second etching step that is different from the first etching step. In more detail, the first etching step can be performed using either a wet etching process or a dry etching process, and the second etching step can be performed using a wet etching process employing hydrogen peroxide ($H_2O_2$). The wet etching process of the first etching step may be performed using an oxide etchant such as hydrofluoric acid or a buffered oxide etchant (BOE).

Due to the reduction of layers, the number of etching steps can be reduced to as little as one or two wet etching steps. Accordingly, the burden on the photoresist pattern 63 during formation of the top metal electrode 59a is remarkably reduced as compared to known methods. In addition, at least the top metal electrode layer 59 is etched using a wet etching technique. Thus, the method according to the present invention can prevent dry etch damage to the insulating layer 57. In other words, the method according to the present invention can prevent pits from being formed in the insulating layer 57.

The photoresist pattern 63 is removed using an ashing process and a wet strip process known to those of ordinary skill in the art. The ashing and wet strip processes will not form voids in the first metal interconnection line 55a because no pits were formed in the insulating layer 57 during the formation of the top metal electrode 59a as described above.

According to the present invention, the top metal electrode is formed using only a single wet etching step or two wet etching steps. Thus, the method according to the present invention can prevent the photoresist pattern from being lifted or deformed during formation of the top electrode.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of fabricating a semiconductor device comprising:
    forming a first insulating layer on a substrate;
    forming an interconnection line within the first insulating layer, wherein the interconnection line functions as a first electrode;
    forming a second insulating layer on the first insulating layer including the interconnection line;
    forming an electrode layer and an oxide layer on the second insulating layer;
    forming a photoresist pattern on the oxide layer;
    etching the oxide layer and the electrode layer to form a second electrode and an oxide layer pattern stacked over the interconnection line, wherein at least the electrode layer is wet-etched and the oxide lever is one of wet-etched and dry-etched; and
    removing the photoresist pattern.

2. The method of claim 1, wherein the electrode layer is formed of one of a tantalum layer, a tantalum nitride layer, a titanium layer and a titanium nitride layer.

3. The method of claim 1, wherein etching is performed using a mixture of hydrofluoric acid and nitric acid.

4. The method of claim 1, wherein the electrode layer is formed of one of a tungsten layer and a tungsten nitride layer.

5. The method of claim 1, wherein the electrode layer is wet-etched using hydrogen peroxide.

6. The method of claim 1, further comprising using the photoresist pattern as an etching mask.

7. The method of claim 1, wherein the electrode layer is formed from metal.

8. The method of claim 1, wherein the interconnection line is formed from metal.

9. The method of claim 1, wherein the interconnection line is formed using a damascene technique.

10. The method of claim 1, wherein the second insulating layer is formed of a dielectric layer.

11. The method of claim 9, wherein the interconnection line is formed from a copper layer.

12. The method of claim 10, wherein the dielectric layer is formed of one of a silicon nitride layer, a silicon carbide layer, a silicon oxycarbide layer and a silicon carbonitride layer.

13. A method of fabricating a semiconductor device comprising:
    forming a first insulating layer on a substrate;
    forming an interconnection line within the first insulating layer, wherein the interconnection line functions as a first electrode;
    forming a second insulating layer on the first insulating layer including the interconnection line;
    forming an electrode layer on the second insulating layer;
    forming a photoresist pattern on the electrode layer;
    wet-etching the electrode layer to form a second electrode;
    forming an oxide layer on the electrode layer; and
    one of wet-etching and dry-etching the oxide layer.

14. The method of claim 13, wherein the interconnection line is formed from metal.

15. The method of claim 13, wherein the interconnection line is formed from copper using a damascene process.

16. The method of claim 13, wherein the second insulating layer is a dielectric layer formed of one of a silicon nitride layer, a silicon carbide layer, a silicon oxycarbide layer and a silicon carbonitride layer.

17. The method of claim 13, wherein the electrode layer is formed of one of a tantalum layer, a tantalum nitride layer, a titanium layer, a titanium nitride layer, a tungsten layer and a tungsten nitride layer.

18. The method of claim 13, wherein the electrode layer is wet-etched using one of hydrogen peroxide and a mixture of hydrofluoric acid and nitric acid.

19. The method of claim 13, further comprising removing the photoresist pattern.

20. The method of claim 13, wherein the electrode layer is formed from metal.

* * * * *